United States Patent [19]
Horinaga

[11] 3,821,565
[45] June 28, 1974

[54] SWITCHING CIRCUIT UTILIZING GATE-CONTROLLED SWITCHING DEVICE

[75] Inventor: Hiroshi Horinaga, Kanagawa-ken, Japan

[73] Assignee: Sony Corporation, Tokyo, Japan

[22] Filed: May 11, 1973

[21] Appl. No.: 359,606

[30] Foreign Application Priority Data

May 15, 1972 Japan ........ 47-47922
May 15, 1972 Japan ........ 47-56590

[52] U.S. Cl. ........ 307/252 B, 307/254, 307/252 M, 307/252 I

[51] Int. Cl. ........ H03k 17/00

[58] Field of Search ........ 307/252 B, 252 N, 252 C, 307/252 K, 252 M, 252 I; 315/340

[56] References Cited

UNITED STATES PATENTS 3,271,700 9/1966 Gutzwiller ........ 307/252 C
3,470,455 9/1969 Korda ........ 307/252 C

FOREIGN PATENTS OR APPLICATIONS 15,088 5/1970 Japan ........ 307/252 J

*Primary Examiner*—Rudolph V. Rolinec
*Assistant Examiner*—B. P. Davis
*Attorney, Agent, or Firm*—Lewis H. Eslinger, Esq.; Alvin Sinderbrand, Esq.

[57] ABSTRACT

A switching circuit which utilizes a gate controlled switching device (GCS) or thyristor of the gate turn-off type has its gate connected with a series connection of another switching element and a voltage source and with a current supplying means arranged in parallel to the series connection. The other switching element, which may be a GCS or transistor, has its conductivity controlled by a control signal applied thereto, and the gate controlled switching device is supplied with a turn-off gate current from the voltage source through such other switching element when the latter is conductive, whereas the gate controlled switching device is supplied with a turn-on gate current from the current supplying means when the other switching element is non-conductive.

11 Claims, 13 Drawing Figures

SWITCHING CIRCUIT UTILIZING GATE-CONTROLLED SWITCHING DEVICE

BACKGROUND OF THE INVENTION

1. Field of the Invention

This invention relates generally to a switching circuit using a semiconductor switching device, and more particularly is directed to an improved switching control circuit for a gate controlled switching device which causes the latter to be conductive and nonconductive in accordance with a control signal.

2. Description of the Prior Art

In the field of switching circuits utilizing a semiconductor switching device, it has been proposed to employ a thyristor, for example, of the gate turn-off type, which is a semiconductor device also known as a gate-controlled switching device (hereinafter referred to as a GCS). In semiconductor switching circuits used as solid-state horizontal deflection circuits of television receivers or the like and in which the switching element is required to withstand a high voltage and must be capable of carrying a substantially large current, it has been considered to be preferable to utilize a GCS as the switching element due to its avoidance of several disadvantages occurring when other semiconductor switching devices, for example, transistors, are employed.

A GCS or thyristor of the gate-turn-off type is composed of four semiconductor layers, for example, first and second P-type layers, and first and second N-type layers with the first P-type layer being an anode, the second N-type layer being a cathode, and the second P-type layer being a gate. In such GCS, a gate current is applied between the gate and cathode to control the conductivity between the anode and cathode.

In general, the GCS is desirable in that it is easily designed to withstand a high voltage between its anode and cathode and to carry a large current through its anode and cathode as compared with transistors or other semiconductor switching devices. Further, pnce the switch effect between the anode and cathode has been turned ON or OFF by the gate current between the gate and cathode, it remains in the ON or OFF state even though the gate current is not continuously applied to the GCS. Accordingly, the GCS is capable of being switched with decreased power dissipation in the gate current applying circuit, and is also capable of switching a relatively large current. However, existing switching circuits employing a GCS as the switching element thereof are disadvantageous in that a high level control pulse signal has to be supplied to the gate of the GCS to produce the gate current requisite for reliably controlling the GCS, particularly for turning off the latter, and a capacitor has to be provided between a source of the control pulse signal and the gate of the GCS to reform the control pulse signal supplied to the gate.

SUMMARY OF THE INVENTION

Accordingly, it is an object of this invention to provide an improved switching circuit using a gate controlled switching device or thyristor of the gate turn-off type as a switching element therein.

Another object is to provide a switching circuit using a gate controlled switching device and in which the conductivity of the latter is reliably controlled by a low level switching control signal.

A further object is to provide a switching circuit using a gate controlled switching device, as aforesaid, which includes an improved gate current applying circuit for effectively controlling the conductivity of the gate controlled switching device.

Still a further object of this invention is to provide a switching circuit using a gate controlled switching device controlled by an improved gate current applying circuit, as aforesaid, and which is suitable for use in a solid-state horizontal deflection output circuit of a television receiver.

In accordance with an aspect of this invention, the gate of the GCS employed as the primary switching element is connected with a series connection of another or secondary switching element and a voltage source and also with a current supplying means which is in parallel with the series connection, and the secondary switching element, which may be another GCS or a transistor, has its conductivity controlled by a control signal applied thereto. With the foregoing arrangement, the GCS constituting the primary switching element is supplied with a turn-on gate current from the voltage source through the secondary switching element when the latter is conductive, and with a turn-off gate current from the current supplying means when the secondary switching element is nonconductive.

The above, and other objects, features and advantages of the invention, will be apparent from the following detailed description of preferred embodiments of the invention which is to be read in connection with the accompanying drawings.

DESCRIPTION OF THE PREFERRED EMBODIMENTS

Figures 1, 3, 4, 5:
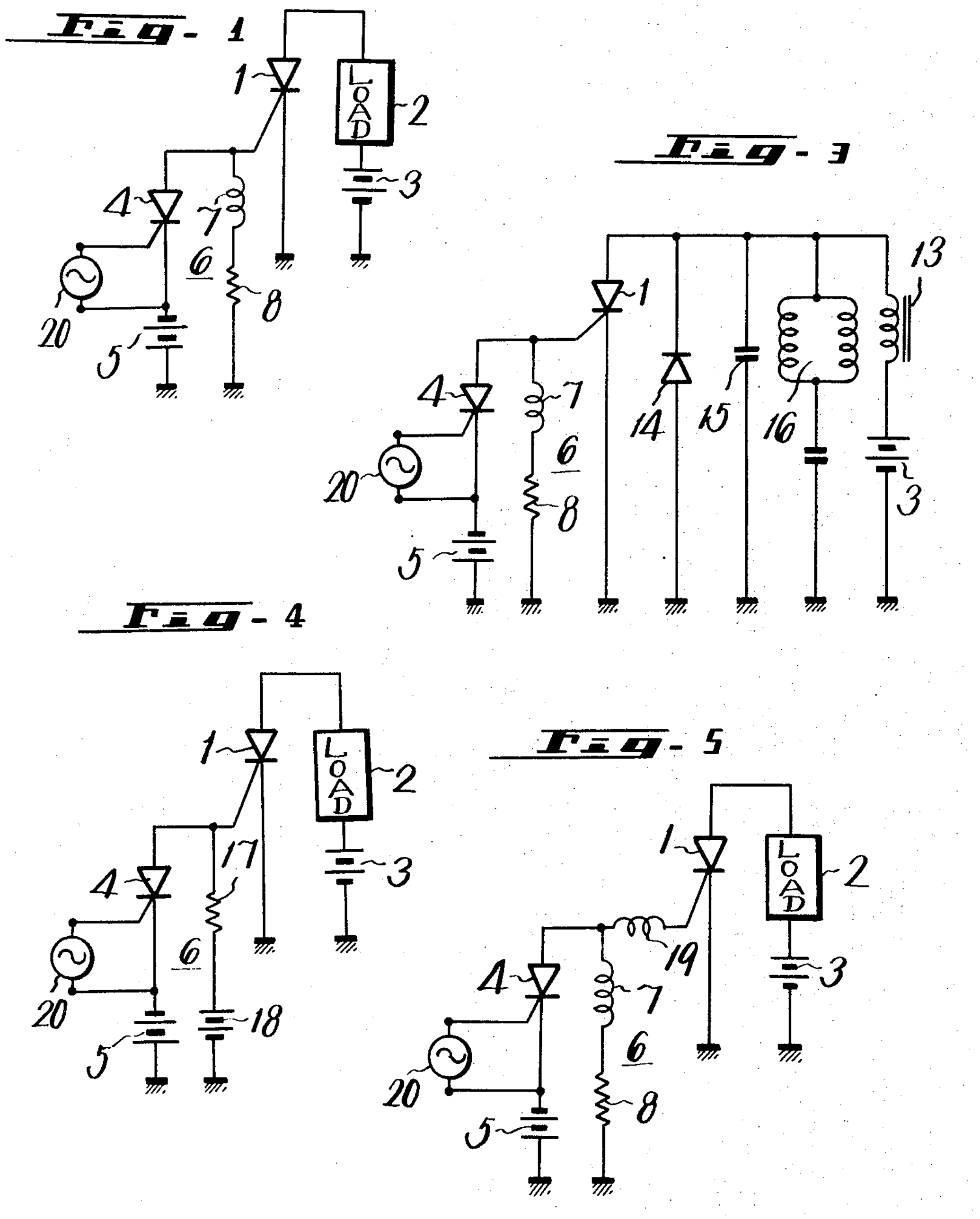
FIG. 1 is a diagrammatic view of one embodiment of a switching circuit according to the present invention.
FIG. 3 is a schematic circuit diagram of a horizontal deflection output circuit employing the switching circuit of the present invention which is shown in FIG. 1.
FIGS. 4 to 8, inclusive, are views similar to FIG. 1, but showing other embodiments of switching circuits according to the present invention.

Referring to the drawings in detail, and initially to FIG. 1 thereof, it will be seen that the switching circuit according to this invention, as there illustrated, employs a GCS or thyristor of the gate turn-off type 1 as the primary switching element. The anode of GCS 1 is connected through a load 2 to a DC power source 3, and the cathode of GCS 1 is connected to ground. Further, in accordance with this invention, the gate of GCS 1 is connected to a secondary switching element 4 and a DC voltage source 5, in series, and to a current supplying means 6 which is in parallel with the series connection of switching element 4 and voltage source 5.

In the embodiment of FIG. 1, the secondary switching element 4 is also constituted by a GCS, and the gate of GCS 1 is connected to ground through the anode-cathode of GCS 4 and DC voltage source 5. The polarity of DC voltage source 5 is arranged, as shown, so that a current may flow from the cathode of GCS 1 to its gate in a current path that includes GCS 4 and DC voltage source 5, thereby to turn OFF GCS 1 when the secondary switching element or GCS 4 is conductive or turned ON. Further, the voltage value of DC voltage source 5 is selected to be smaller than the gate-cathode breakdown voltage of GCS 1.

Figure 2A:
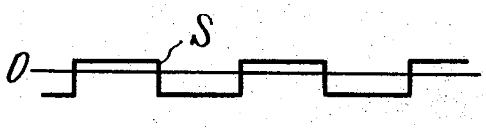
FIGS. 2A to 2F, inclusive, are waveform diagrams to which reference will be made in explaining the operation of the switching circuit shown in FIG. 1.

It will be further seen that, in the embodiment of FIG. 1, the current supplying means 6 consists of a coil 7 and a resistor 8 connected in series between the gate of GCS 1 and ground, and functions to supply a gate current which flows through GCS 1 from its gate to its cathode for turning ON GCS 1 when the secondary switching element or GCS 4 is turned OFF or made non-conductive. Finally, in the embodiment of FIG. 1 a control signal S (FIG. 2A) is applied to the gate of GCS 4 from a suitable control signal source 20, so that GCS 4 is turned ON or made conductive during each period when control signal S is positive and GCS 4 is turned OFF or made non-conductive during each period when control signal S is negative.

Figure 2B:
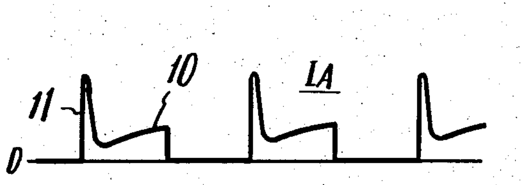
Figure 2C:
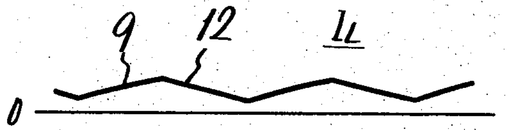
Figure 2D:
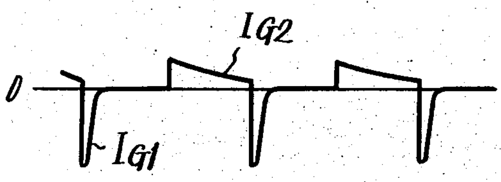
Figure 2E:
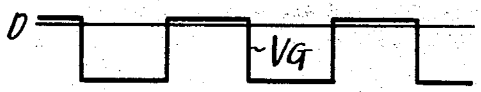
Figure 2F:

The above described switching circuit according to this invention operates as follows:

During each positive period of control signal S, that is, when GCS 4 is conductive, an anode current $I_A$ (FIG. 2B) flows from DC voltage source 5 to GCS 4 through resistor 8 and coil 7 of current supplying means 6. The current $I_L$ (FIG. 2C) flowing through the coil 7 at this time increases gradually, as indicated at 9, in accordance with the resistance value of the resistor 8 and the inducdance of the coil 7. However, at the instant when GCS 4 is made conductive, a large anode current, indicated at 11 on FIG. 2B flows in GCS 4 through the cathode-gate of GCS 1 from the DC voltage source 5, that is, at the instant when GCS 4 is made conductive, a negative gate current $I_{G1}$ (FIG. 2D) flows from the cathode of GCS 1 to its gate so that GCS 1 is turned OFF or made nonconductive, as shown in FIG. 2F. Thereafter, that is, after the initial large anode current surge 11 which terminates with the turning OFF of GCS 1, the anode current $I_A$ (FIG. 2B) flowing from DC voltage source 5 through resistor 8 and coil 7 to GCS 4 increases gradually for the remainder of the positive period of control signal S, as indicated at 10 on FIG. 2B, in accordance with the gradual increase in the current $L_L$ flowing through coil 7, as indicated at 9 on FIG. 2C. During the positive period of control signal S, that is, when GCS 4 is turned ON, the gate voltage $V_G$ (FIG. 2E) of GCS 1 has a predetermined negative value, and energy is stored in coil 7.

When control signal S becomes negative, GCS 4 is turned OFF or made non-conductive so that the gate of GCS 1 is thereby isolated from DC voltage source 5. Further, when GCS 4 is turned OFF, the energy previously stored in coil 7 causes a gradually decreasing current, indicated at 12 on FIG. 2C, to be supplied therethrough to the gate-cathode of GCS 1. Thus, a positive gate current indicated at $I_{G2}$ on FIG. 2D flows through GCS 1 from its gate to its cathode so that GCS 1 is turned ON or made conductive (FIG. 2F) to pass a current therethrough to load 2 from DC power source 3. Accordingly, GCS 1 is repeatedly turned ON and OFF, that is, made conductive and non-conductive, in response to the alternating negative and positive periods, respectively, of control signal S.

In general, the ratio of the current that has to be passed through a GCS from its cathode to its gate for turning OFF the GCS, that is, the turn-off gate current, to the anode current that is to be cut off thereby is approximately constant for a predetermined range of anode currents. Such ratio is dependent upon the design of the GCS which, in the case of GCS 1, may be selected, for example, so that an anode current of 5 amperes flowing through load 2 and the anode of GCS 1 can be cut off by a turn-off gate current of 1 ampere, and so that the GCS 1 is turned ON by a turn-on gate current of 30 milli-amperes. Thus, if GCS 4 has the same ratio of turn-off gate current to the anode current to be cut off thereby, it will be seen that the turn-on gate current of 30 milliamperes for GCS 1, which is the anode current of GCS 4, can be cut off by a turn-off gate current of only 6 milli-amperes supplied to GCS 4 in response to the negative period of control signal S from source 20.

Therefore, with the circuit shown in FIG. 1, a very small turn-off gate current may be supplied to GCS 4, that is, the secondary switching element, to cut off the anode current of GCS 4 corresponding to the small turn-on gate current for turning ON GCS 1, that is, the primary switching element.

Further, continuing with the assumption the GCS 4 is similar to GCS 1 and, therefore also has a turn-on gate current of 30 milli-amperes, it will be apparent that the supplying of such small turn-on gate current to GCS 4 for turning ON the latter, will permit the requisite turn-off gate current of 1 ampere to be supplied to GCS 1 from DC voltage source 5. Therefore, the primary switching element or GCS 1 of the described circuit is also turned OFF in response to the supplying of a relatively small current to the secondary switching element or GCS 4. It will be apparent from the foregoing that the described circuit embodying this invention is effective to control the switching action of GCS 1 by means of a relatively low level control signal S.

In an example of the switching circuit of FIG. 1, and in which the switching elements GCS 1 and GCS 4 are turned ON and OFF by the gate current mentioned above, it was found that the described operations were achieved with the voltage of source 5 being −10 volts, the inductance of coil 7 being 1 milli-Henry and the resistance of resistor 8 being 100 ohms.

Referring now to FIG. 3, it will be seen that the switching circuit of FIG. 1 is there shown applied to a horizontal deflection output circuit of a television receiver with the components of such circuit which correspond to those described above with reference to FIG. 1 being identified by the same reference numerals.

In the circuit of FIG. 3, GCS 1 is shown to be connected through an output coil 13 to the DC power source 3 and, in parallel therewith, to a damper diode 14, a capacitor 15 for resonance and a horizontal deflection coil 16. The GCS 4 is supplied between its gate-cathode with a driving pulse having a pulse width equal to the horizontal period from a horizontal oscillator 20'. Thus, the turning ON and OFF of GCS 1 is controlled in response to the relatively low level driving pulse supplied to GCS 4 so as to cause a saw-tooth waveform current to flow through horizontal deflection coil 16.

In the above described embodiments, the current supplying means 6 has been constituted by a coil 7 and resistor in series. However, such current supplying means 6 may take other forms, such as, in series connection of a resistor 17 and a DC power source 18, as shown on FIG. 4, in which the other components are the same as described above with reference to FIG. 1.

Further, as shown on FIG. 5, a coil 19 may be interposed, at any point, in the current path of the turn-off gate current for GCS 1, for example, between the gate of GCS 1 and the anode of GCS 4. By reason of such coil 19, the turn-off gate current $I_{G1}$ for GCS 1 is increased abruptly at its initial period, that is, the slope of the onset of turn-off gate current $I_{G1}$ is increased, so that the switching action of GCS 1 is correspondingly abrupt.

Figure 6:
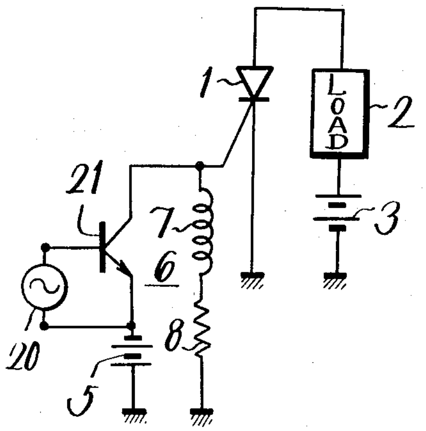

Although the secondary switching element in the above described switching circuits according to this invention is constituted by the GCS 4, it should be noted that such secondary switching element can take other forms, for example, that of a transister 21, as shown on FIG. 6 in which the other components of the switching circuit are the same as in the embodiment of FIG. 1 and identified by the same reference numerals. As shown, the transistor 21 has its collector connected to the gate of GCS 1, its emitter connected to DC voltage source 5, and its base supplied with the control signal from source 20. Since only a small current, that is, the relatively small turn-off gate current for GCS 1, is to flow through the emitter-collector of transistor 21 when the latter is turned ON, it is apparent that such transistor can be selected to have a relatively small current capacity.

It will be understood that transistor 21 is switched ON and OFF in accordance with the control signal from source 21 to provide a turn-off gate current from the cathode to the gate of GCS 1 in the ON state of transistor 21 due to DC voltage source 5, and to provide a turn-on gate current from current supplying means 6 to the gate-cathode of GCS 1 in the OFF state of transistor 21. Thus, transistor 21 operates similarly to GCS 4 in controlling the switching action of GCS 1.

In the switching circuits of FIGS. 1–6, if GCS 1 is overloaded, its anode current may increase to an excessive value. In the event of such excessive anode current, GCS 1 may not be turned OFF even in response to turning ON of the secondary switching element, that is, GCS 4 or transistor 21, which gives rise to the danger that GCS 1 may be damaged or destroyed. In order to avoid the foregoing danger in switching circuits according to this invention, an anode current sensing load may be inserted in the anode current path of GCS 1 and, when the voltage across the anode current sensing load exceeds a predetermined value, such voltage controls a third switching element for supplying a turn-on gate current to GCS 4 and thereby providing the turn-off gate current for GCS 1. In the foregoing arrangement, the anode current which causes the third switching element to provide the turn-on gate current for GCS 4 is selected to be lower than the anode current of GCS 1 at which the turn-off gate current for the latter is ineffective to turn OFF GCS 1.

Figure 7:
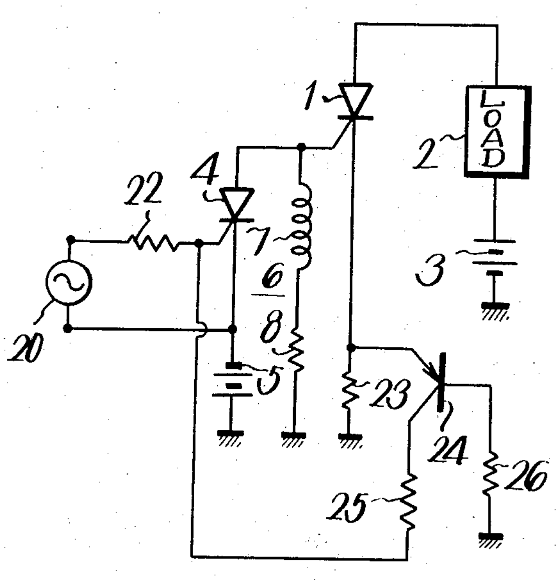

Referring now to FIG. 7, it will be seen that, in the switching circuit according to this invention as there illustrated, a PNP-type transistor 24 is employed as the third switching element, and the cathode of GCS 1 is grounded through a resistor 23 which acts as the anode current sensing load. The connection between the cathode of GCS 1 and resistor 23 is connected to the emitter of transistor 24 which has its collector connected through a protective resistor 25 to the gate of GCS 4, and the base of transistor 24 is grounded through a protective resistor 26. In the circuit of FIG. 7, the resistance of resistor 23 is selected so that, when the anode current of GCS 1 or the current flowing through resistor 23 exceeds a predetermined maximum current, the voltage across the resistor 23 becomes large enough to turn ON transistor 24. As previously noted, such predetermined maximum current at which the voltage across resistor 23 is effective to turn ON transistor 24 is within the range of stable operation of GCS 1, that is, less than the anode current of GCS 1 at which the turn-off gate current from DC voltage source 5 is ineffective to turn OFF GCS 1 in response to turning ON of GCS 4.

Accordingly, when the anode current flowing to the anode of the GCS 1 is within the range for stable operation of the latter, the transistor 24 is in its OFF state and no current flows from transistor 24 to the gate of GCS 4 and hence the circuit shown in FIG. 7 performs the switching operations as described above with reference to FIG. 1. At the instant that the anode current of GCS 1 exceeds the predetermined maximum value, the voltage across resistor 23 turns ON transistor 24. In response to the turning ON of transistor 24, a part of the anode current of GCS 1 flows through the emitter-collector of transistor 24 and the resistor 25 to the gate of the GCS 4 as the turn-on gate current therefor so that GCS 4 is turned ON immediately and hence GCS 1 is turned OFF and is maintained in the OFF state until GCS 4 turns OFF again, thereby to avoid desctruction of the GCS 1.

In the circuit of FIG. 7, a resistor 22 is preferably connected between the gate of GCS 4 and control signal source 20, or GCS 4 is driven by a suitable impedance, so that, when transistor 24 is turned ON, a part of the anode current of GCS 1 flowing through transistor 24 is positively supplied to the gate of GCS 4 to turn ON the latter.

Figure 8:
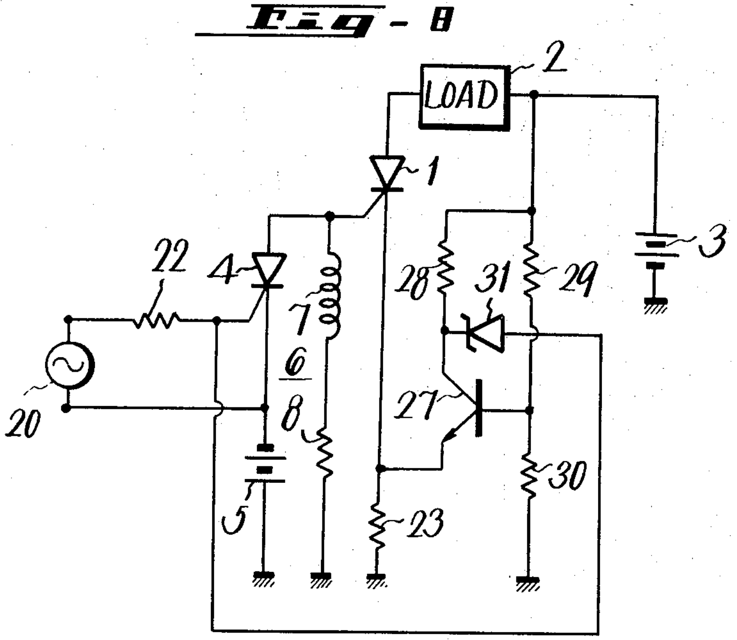

Referring now to FIG. 8, it will be seen that, in another embodiment of the invention, an NPN-type transistor 27 is employed as the third switching element with the connection between the cathode of GCS 1 and resistor 23 being connected to the emitter of transistor 27, and the DC power source 3 being connected through a resistor 28 to the collector of transistor 27 and grounded through a series connection of resistors 29 and 30. Further, as shown, the connection between resistors 29 and 30 is connected to the base of transistor 27 and the collector of transistor 27 is connected to the gate of GCS 4 through a Zener diode 31. In the circuit of FIG. 8, the resistance values of resistors 23, 28, 29 and 30 are selected so that when a stable state anode current flow to GCS 1, transistor 27 is turned ON and, when the anode current of GCS 1 or the current flowing through resistor 23 exceeds the maximum current for stable operation, transistor 27 is turned OFF.

Accordingly, when the anode current flowing to GCS 1 is within the range for stable operation, transistor 27 is in its ON state and its collector potential is lowered so that, even if the gate potential of GCS 4 is negative, the Zener diode 31 is not turned on and hence no turn-on gate current flows to GCS 4 through Zener diode 4. However, if an anode current exceeding the maximum current for stable operation flows to GCS 1, transistor 27 is turned OFF to increase its collector potential, so that Zener diode 31 is made conductive and a turn-on gate current flows from DC power source 3 to the gate of GCS 4 through resistor 28 and Zener diode 31, whereby to turn ON GCS 4 immediately and hence turn OFF GCS 1 to avoid the destruction of the latter.

It will be apparent that, in all of the above described embodiments of the invention, the switching action of GCS 1 in respect of a large current flowing therethrough can be controlled by a remarkably small driving or control signal supplied to the secondary switching element connected to the gate of GCS 1, thereby to enhance the driving efficiency of the switching circuit. Particularly when the secondary switching element is constituted by a gate controlled switching device for example, the GCS 4, the impedance thereof is very small in its ON state so that the carriers in the gate of GCS 1 are withdrawn abruptly in a short time period so that the driving efficiency is much improved and also the switching can be carried out positively and sharply.

Further, since the ON and OFF states of GCS 1 connected to load 2 are controlled by the OFF and ON states, respectively, of the second GCS 4, even if the control signal S undergoes transient changes, GCS 1 connected to the load 2 is not subject to ON or OFF control in response to such transient changes. Thus, the circuits according to this invention can carry out their switching operations more positively and stably than the previously existing circuits in which the control signal is supplied directly through a capacitor, a transformer and the like, to the gate of a GCS which is connected to the load. In those cases where the GCS connected to the load is controlled directly with the control signal, such control signal has to be supplied through a capacitor or the like to the gate of the GCS for providing a sufficiently large turn-off gate current. With the circuits according to this invention, however, the secondary switching element is connected to the gate of the GCS connected to the load and the secondary switching element is driven by the control signal so that the driving current provided by the control signal may be remarkably small, as mentioned above. As a result, the circuits according to this invention do not require a capacitor, and hence such circuits can be easily made as integrated circuits.

Further, in the circuits according to this invention, the conditions for making GCS 1 conductive depend upon the voltage of DC voltage source 5 and the characteristics of current supplying means 6, and the conditions for making GCS 1 nonconductive depend upon the voltage of DC voltage source 5 and the characteristics of second GCS 4. Thus, the turn-on gate current for GCS 1 has no influence on the turn-off gate current for that switching element, with the result that the circuits embodying this invention can be easily designed for optimum operation. The foregoing is not the case in the previously existing circuits in which a GCS connected to the load is driven directly by the control signal supplied thereto through a capacitor, transformer or the like.

Further, in the circuits according to this invention, the current controlled by the GCS 1 may vary in frequency over a wide range from a DC current to a maximum frequency determined by GCS 1.

Having described several specific embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A switching circuit, comprising a gate controlled switching device having an anode, cathode and gate for controlling the passage of a current from said anode to said cathode in dependence on a gate current flowing in a path including said gate and cathode, secondary switching means connected to said gate and having ON and OFF states, a voltage source connected in series with said secondary switching means and having its polarity arranged for providing a first gate current flowing from said cathode to said gate in said ON state of said secondary switching means, current supplying means comprising an inductor connected to said gate substantially in parallel with the series connection of said secondary switching means and said voltage source, said current supplying means providing a second gate current flowing from said gate to said cathode in the OFF state of said switching means, and means supplying a control signal to said secondary switching means for selectively controlling the ON and OFF states of said secondary switching means in accordance with said control signal.

2. A switching circuit according to claim 1, wherein said current supplying means further includes a resistor connected in series to said inductor.

3. A switching circuit according to claim 1, further comprising an additional inductor interposed in said path of said first gate current flowing in said ON state of said secondary switching means.

4. A switching circuit according to claim 1, wherein said secondary switching means includes a second gate controlled switching device having an anode connected to said gate of the first mentioned gate controlled switching device, a cathode connected to said voltage source and a gate connected to said means supplying said control signal.

5. A switching circuit according to claim 1, wherein said secondary switching means includes a transistor having a collector-emitter path connected to said gate of the gate controlled switching device and a base connected to said means supplying the control signal.

6. A switching circuit according to claim 1, further comprising current sensing means interposed in a path of the current flowing from said anode to said cathode of the gate controlled switching device, and controlling means connected between said secondary switching means and said current sensing means for conditioning said secondary switching means in said ON state when said current sensing means detects a current in excess of a predetermined value, whereby to turn OFF the gate controlled switching device and protect the latter from an excess current.

7. A switching circuit according to claim 6, wherein said current sensing means includes a resistor connected to said cathode of said gate controlled switching device.

8. A switching circuit according to claim 7, wherein said controlling means includes an additional switching means which is switched in response to the output of said current sensing means for supplying a switching control signal to said secondary switching means.

9. A switching circuit according to claim 8, wherein said additional switching means includes a PNP-type transistor having an emitter connected to said cathode of the gate controlled switching means between the latter and said resistor of the current sensing means, a collector connected to said secondary switching means for turning ON the latter with an emitter-collector current flowing through said transistor, and a base connected to ground.

10. A switching circuit according to claim 8, wherein said additional switching means includes an NPN-type transistor having a collector connected through a Zener diode to said secondary switching means, an emitter connected to said cathode of the gate controlled switching means between the latter and said resistor of the current sensing means, and voltage divider means connecting said collector and the base of said transistor with the source of the anode current for said gate controlled switching means so that said transistor is made conductive and said Zener diode is turned OFF only so long as the current flowing from said anode to said cathode is below said predetermined value and, upon exceeding said predetermined value, said transistor is made non-conductive and said Zener diode is turned ON for turning ON said secondary switching means.

11. A switching circuit according to claim 1, wherein said gate controlled switching means is constituted by a thyristor of the gate turn-off type.

* * * * *